(12) United States Patent
Tsorng et al.

(10) Patent No.: US 11,729,935 B2
(45) Date of Patent: Aug. 15, 2023

(54) RISER MODULE LOCKING MECHANISM FOR SERVER CHASSIS

(71) Applicant: QUANTA COMPUTER INC., Taoyuan (TW)

(72) Inventors: Yaw-Tzorng Tsorng, Taoyuan (TW); Jen-Jia Liou, Taoyuan (TW); Hsi-Chi Chien, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 17/534,796

(22) Filed: Nov. 24, 2021

(65) Prior Publication Data
US 2023/0051799 A1    Feb. 16, 2023

Related U.S. Application Data

(60) Provisional application No. 63/260,307, filed on Aug. 16, 2021.

(51) Int. Cl.
*H05K 7/14*  (2006.01)

(52) U.S. Cl.
CPC ......... *H05K 7/1405* (2013.01); *H05K 7/1424* (2013.01)

(58) Field of Classification Search
CPC .. H05K 7/1405; H05K 7/1424; H05K 7/1408; H05K 7/1409
See application file for complete search history.

(56) References Cited

U.S. PATENT DOCUMENTS

2015/0103492 A1*  4/2015  Wu ..................... H05K 7/1461
                                                               361/726
2021/0274667 A1*  9/2021  Lin ..................... H05K 7/1411

FOREIGN PATENT DOCUMENTS

CN            102791103 A       11/2012

OTHER PUBLICATIONS

TW Office Action for Application No. 111110328, dated Oct. 18, 2022, w/ First Office Action Summary.

* cited by examiner

*Primary Examiner* — Anthony Q Edwards
*Assistant Examiner* — Mudakir Hussien
(74) *Attorney, Agent, or Firm* — Nixon Peabody LLP

(57) ABSTRACT

A computing system includes a chassis and a cage. The chassis includes one or more locking hooks. The cage includes a handlebar, a bar-linkage assembly, and a crank coupled to both the handlebar and the bar-linkage assembly. Rotating the handlebar from an unlocked position to a locked position lowers the cage relative to the chassis until the cage is locked in the one or more locking hooks of the chassis.

20 Claims, 8 Drawing Sheets

RISER MODULE LOCKING MECHANISM FOR SERVER CHASSIS

CROSS-REFERENCE TO RELATED APPLICATIONS

This application claims priority from and benefit of U.S. Provisional Patent Application Ser. No. 63/260,307, filed on Aug. 16, 2021, titled "The effort-saving mechanism design of PCIe Riser Module assembled in the server chassis," which is hereby incorporated by reference herein in its entirety.

FIELD OF THE INVENTION

The present invention relates generally to a locking mechanism, and more specifically, to a locking mechanism for riser modules in computing systems.

BACKGROUND OF THE INVENTION

Computing systems typically have electronic components housed in a chassis. Examples of computing systems include desktop computers, blade servers, rack-mount servers, etc. For organizational purposes, the electronic components can be grouped or housed in cages within the chassis of the computing system. For example, Peripheral Component Interconnect Express (PCIe) riser cages or PCIe riser modules can be used to house one or more PCIe riser cards that accept one or more PCIe cards. In some examples, the PCIe cards can be graphics processing unit (GPU) cards, network interface cards, PCIe storage cards, etc. The electronic components housed in the chassis may need to be replaced or serviced by a service technician. During service, the electronic components may need to be removed. Gaining access to electronic components housed in cages (e.g., PCIe riser cages) may require removal of the cages to replace or service the housed electronic components. Physical force exerted by the service technician to remove the cages in the chassis can be excessive. The present disclosure provides solutions that at least reduce difficulty associated with assembling and disassembling caged components of computing systems.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a computing system includes a chassis and a cage. The chassis includes one or more locking hooks. The cage includes a handlebar, a bar-linkage assembly, and a crank coupled to both the handlebar and the bar-linkage assembly. Rotating the handlebar from an unlocked position to a locked position lowers the cage relative to the chassis until the cage is locked in the one or more locking hooks of the chassis.

In some implementations, the bar-linkage assembly includes a first bar, a second bar, a third bar, and a fourth bar. The second bar is coupled to the first bar, the third bar, and the fourth bar. The fourth bar is coupled the crank. The first bar and the third bar engage with the one or more locking hooks of the chassis. In some implementations, rotating the handlebar from the unlocked position to the locked position rotates the first bar in a same direction as the handlebar and rotates the third bar in an opposite direction than the first bar and the handlebar.

In some implementations, rotating the handlebar from the unlocked position to the locked position increases (i) an angle between the second bar and the first bar and (ii) an angle between the second bar and the third bar. In some implementations, the first bar includes a first locking protrusion and the third bar includes a second locking protrusion. The first and second locking protrusions engage the one or more locking hooks of the chassis to facilitate lowering the cage relative to the chassis. In some implementations, the locking protrusions engaging with the one or more locking hooks of the chassis causes the cage to lower relative to the chassis when the handlebar is rotated from the unlocked position to the locked position. In some implementations, the first locking protrusion and the second locking protrusion move toward each other when the handlebar is rotated from the unlocked position to the locked position.

In some implementations, the chassis further includes one or more guides coupled to the second bar to prevent a rotation of the second bar. Rotating the handlebar from the unlocked position to the locked position causes the second bar to move along the one or more guides toward the crank. In some implementations, the first bar includes a first gliding section and the third bar includes a second gliding section so that rotating the handlebar from the unlocked position to the locked position causes the second bar to glide along the first gliding section and the second gliding section.

In some implementations, at least a portion of the second bar has a curvature that matches a curvature of the crank. In some implementations, the crank has a teardrop shape, and the crank is coupled to the bar-linkage assembly at the tip of the teardrop shape. In some implementations, the cage includes one or more electronic components with a first connector such that lowering the cage relative to the chassis mates the first connector with a second connector on a circuit board of the computing system.

According to certain aspects of the present disclosure, a computing system includes a chassis and a cage. The chassis includes a locking hook. The cage includes a handlebar, a bar-linkage assembly, and a crank. The handlebar is movable between an unlocked position and a locked position. The bar-linkage assembly has a plurality of interconnected bars. At least one bar of the plurality of interconnected bars has a locking protrusion. The crank couples the handlebar to the bar-linkage assembly. The crank rotates in response to movement of the handlebar. Rotation of the crank causes engagement or disengagement between the locking protrusion and the locking hook. The locking protrusion is engaged to the locking hook in the unlocked position. The locking protrusion is disengaged from the locking hook in the locked position.

In some implementations, the plurality of interconnected bars includes a first bar, a second bar, a third bar, and a fourth bar. The second bar is coupled to the first bar, the third bar, and the fourth bar. The fourth bar is coupled the crank. The locking protrusion is a plurality of locking protrusions located on the first bar and the third bar. In some implementations, movement of the handlebar from the unlocked position to the locked position involves rotating the handlebar. The movement of the handlebar causes the first bar to rotate in a same direction as the handlebar. The movement of the handlebar causes the third bar to rotate in an opposite direction than the first bar and the handlebar.

In some implementations, movement of the handlebar from the unlocked position to the locked position increases (i) an angle between the second bar and the first bar and (ii) an angle between the second bar and the third bar. In some implementations, at least a portion of the second bar has a curvature that matches a curvature of the crank. In some implementations, the plurality of locking protrusions engaging with the chassis causes the cage to lower relative to the chassis of the computing system, when the handlebar moves from the unlocked position to the locked position. In some implementations, the plurality of locking protrusions moves toward each other when the handlebar moves from the unlocked position to the locked position. In some implementations, the first bar and the third bar are coupled to the second bar at opposite ends of the second bar.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Figure 1:
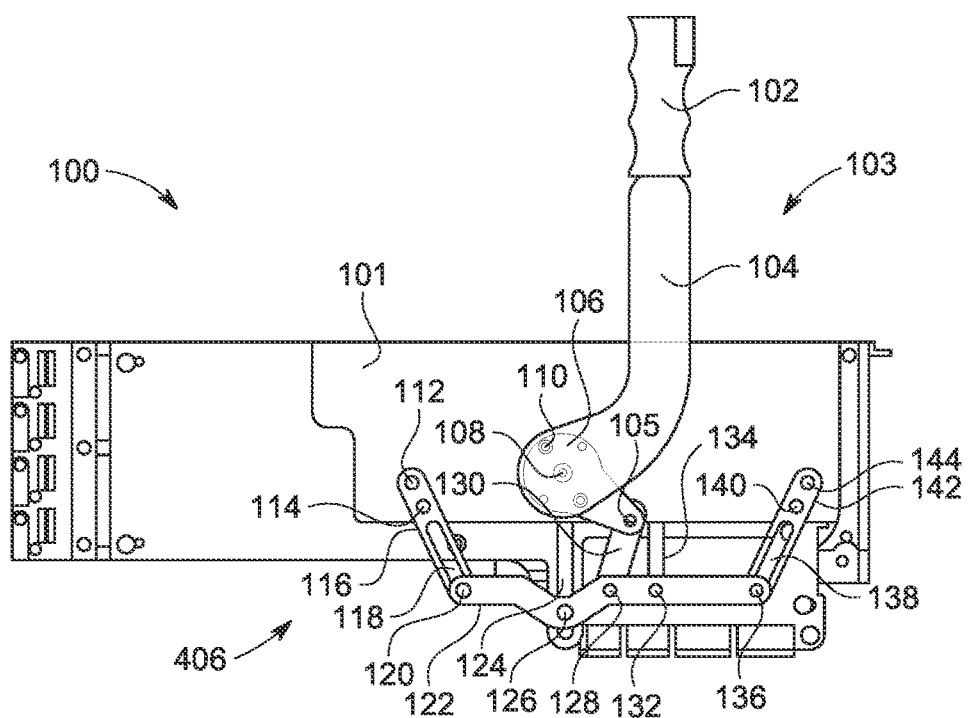
FIG. 1 is a side view showing a locking mechanism on a riser cage in an unlocked position, according to certain aspects of the present disclosure.

Electronic components in one or more cages provided in computing systems can be difficult to access. The cages sometimes have to be removed before the electronic components can be accessed. Cage removal can be a time-intensive activity involving exerting pulling and pushing forces that may damage components within computing systems. Embodiments of the present disclosure provide a locking mechanism that facilitates installing and removing cages in a chassis of a computing system. The locking mechanism reduces an amount of force and effort exerted by a service technician when the service technician is connecting and/or disconnecting electronic components provided in the cages. The locking mechanism also facilitates connecting (or disconnecting) the housed electronic components to (or from) a circuit board installed in the chassis.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 2:
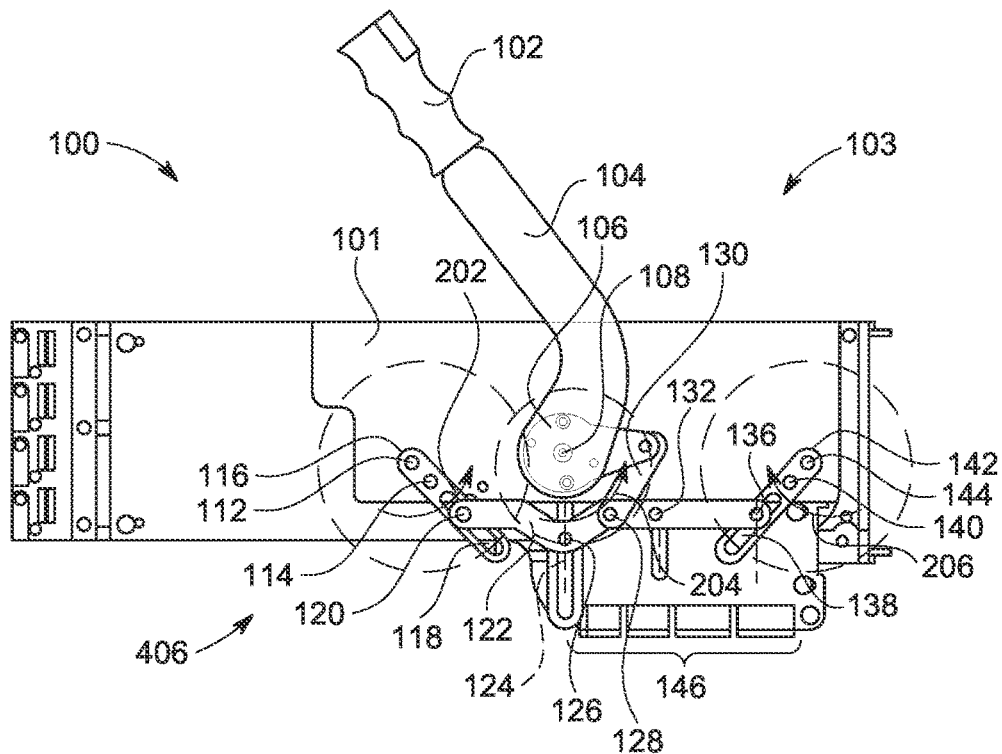
FIG. 2 is a side view showing the locking mechanism of FIG. 1 in an intermediate position, according to certain aspects of the present disclosure.

Referring to FIG. 1, a side view showing a riser cage 100 with a locking mechanism 103 in an unlocked position is provided, according to certain aspects of the present disclosure. The riser cage 100 includes a body 101 for affixing the locking mechanism 103 and a connector 146 (FIG. 2). The body 101 can be metallic. The locking mechanism 103 includes a handle 102 connected to a handlebar 104. The handle 102 provides an ergonomic location for a service technician to operate the handlebar 104. The handlebar 104 is coupled to a bar-linkage assembly 406 via a crank 106. The crank 106 is fastened to the handlebar 104 at one or more locations 110 so that a rotating motion of the handlebar 104 is transferred to the crank 106, causing the crank 106 to rotate as well. The crank 106 rotates in the same direction as the handlebar 104. Both the handlebar 104 and the crank 106 rotate about a first axis 108. A bearing (not shown) can be provided at the first axis 108 to facilitate the rotating motion of the handlebar 104 and the crank 106. The crank 106 and the handlebar 104 are coupled to the body 101 of the riser cage 100 at the first axis 108.

The crank 106 in FIG. 1 has a teardrop shape, but in some implementations, the crank 106 can be circular. The crank 106 is coupled to the bar-linkage assembly 406 at a crank-linkage pivot 105. The crank-linkage pivot 105 is located at a tip of the teardrop shape of the crank 106. The bar-linkage assembly 406 coupled to the crank 106 includes a plurality of interconnected bars. The bar-linkage assembly 406 includes a first bar 116, a second bar 122, a third bar 142, and a fourth bar 130. The first bar 116 is directly coupled to the second bar 122, which is directly coupled to both the third bar 142 and the fourth bar 130.

The first bar 116 is coupled to the body 101 of the riser cage 100 at a first pivot 112. The first pivot 112 can include a bearing that facilitates rotating the first bar 116 in a plane parallel to the body 101 of the riser cage 100. The first bar 116 includes a first gliding section 118. The first gliding section 118 is a spacing in the first bar 116 that allows the second bar 122 to glide along the first bar 116. The first gliding section 118 also facilitates rotating the first bar 116 relative to the second bar 122.

Similarly, the third bar 142 is coupled to the body 101 of the riser cage 100 at a second pivot 144. The second pivot 144 facilitates rotating the third bar 142 in the same plane where the first bar 116 rotates. The third bar 142 includes a second gliding section 138. The second gliding section 138 is a spacing in the third bar 142 that allows the second bar 122 to glide along the third bar 142. The second gliding section 138 also facilitates rotating the third bar 142 relative to the second bar 122. In some implementations, when the locking mechanism 103 is in the unlocked position, an angle between the first bar 116 and the second bar 122 is about 115 degrees, and the angle between the third bar 142 and the second bar 122 is also about 115 degrees. The first bar 116 and the third bar 142 include a first locking protrusion 114 and a second locking protrusion 140, respectively.

The second bar 122 is coupled to the first bar 116 and the third bar 142, at a first end 120 and a second end 136, respectively. The first end 120 and the second end 136 includes a bearing, button, fastener, or some other type of coupler, for joining the first bar 116 and the third bar 142 to the second bar 122. When the locking mechanism 103 is in the unlocked position of FIG. 1, the first and second ends 120, 136 of the second bar 122 are positioned at an ends of both the first bar 116 and the third bar 142. The second bar 122 can have multiple couplers 126, 132 that couple the second bar 122 to one or more guides 124, 134 in the body 101 of the riser cage 100. The multiple couplers 126, 132 and the one or more guides 124, 134 restrict motion of the second bar 122, preventing the second bar 122 from moving laterally and ensuring that the second bar 122 only moves up and down.

The fourth bar 130, coupled to the crank 106, is lifted up and down by the crank 106 as the handlebar 104 rotates counterclockwise and clockwise, respectively. The fourth bar 130 is coupled to the second bar 122 at a third pivot 128. As the crank 106 moves the fourth bar 130 up and down, the fourth bar 130 pulls the second bar 122 up and down at the third pivot 128. FIG. 2 is a side view showing the locking mechanism 103 of FIG. 1 in an intermediate position, as the second bar 122 is moved up in response to the handlebar 104 being slightly rotated counterclockwise.

In FIG. 2, rotating the handlebar 104 counterclockwise, as indicated by direction 204, causes the first bar 116 to rotate counterclockwise, as indicated by direction 202. The first bar 116 rotates about the first pivot 112, increasing the angle between the first bar 116 and the second bar 122. Similarly, rotating the handlebar 104 counterclockwise causes the third bar 142 to rotate clockwise, as indicated by direction 206. The third bar 142 rotates about the second pivot 144, increasing the angle between the third bar 142 and the second bar 122. To facilitate the first bar 116 and the third bar 142 rotating, the second bar 122 glides along the first gliding section 118 and the second gliding section 138. The second bar 122 is also shown to move up along the one or more guides 124, 134.

Figure 3:
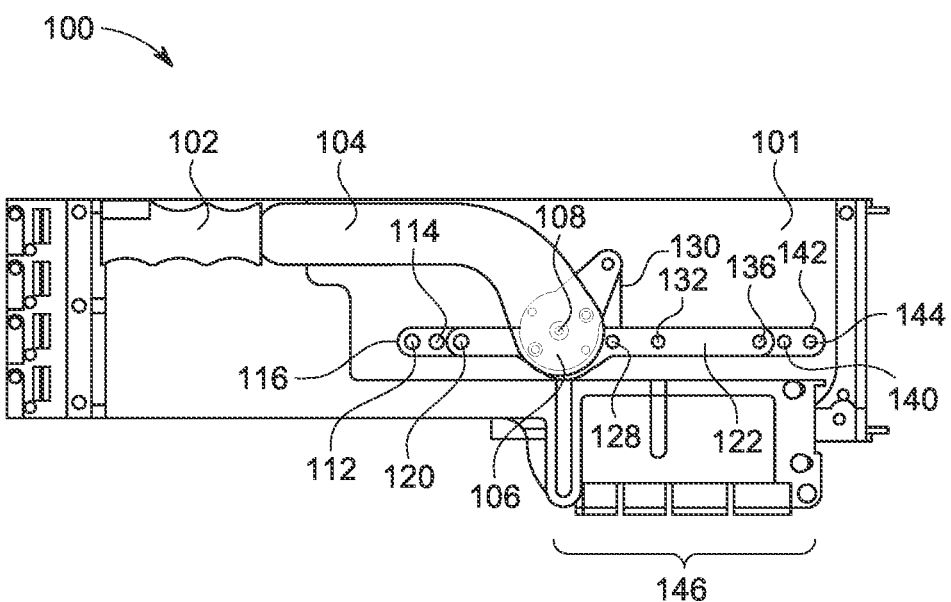
FIG. 3 is a side view showing the locking mechanism of FIG. 1 in a locked position, according to certain aspects of the present disclosure.

FIG. 3 is a side view showing the locking mechanism 103 of FIG. 1 in a locked position, according to certain aspects of the present disclosure. In the locked position, the first end 120 and the second end 136 of the second bar 122 are aligned with the first bar 116 and the third bar 142. The second bar 122 is at an extreme of the first gliding section 118 (FIG. 2) and the second gliding section 138 (FIG. 2). The second bar 122 can no longer move up.

In some implementations, the second bar 122 is not a straight bar as shown in FIGS. 1 and 2, but includes a curvature that matches the crank 106. The curvature of the second bar 122 allows placing the first pivot 112 and the second pivot 144 at a comparable elevation to the crank 106. Rotating the first bar 116 and the third bar 142, at the first pivot 112 and the second pivot 144, respectively, causes the second bar 122 to move up towards the crank 106. Thus, the curvature of the second bar 122 allows the first end 120 and the second end 136 of the second bar 122 to move up to a same elevation as the first pivot 112 and the second pivot 144.

In some implementations, the second bar 122 does not include the curvature and the location of the first pivot 112, and the second pivot 144 is at an elevation that is lower than the crank 106. In some implementations, when the second bar 122 is a straight bar, a length of the first gliding section 118 (FIG. 2) and a length of the second gliding section 138 (FIG. 2) is engineered so that the first end 120 and the second end 136 of the second bar 122 cannot move up to a same elevation as the first pivot 112 and the second pivot 144.

Figure 4:
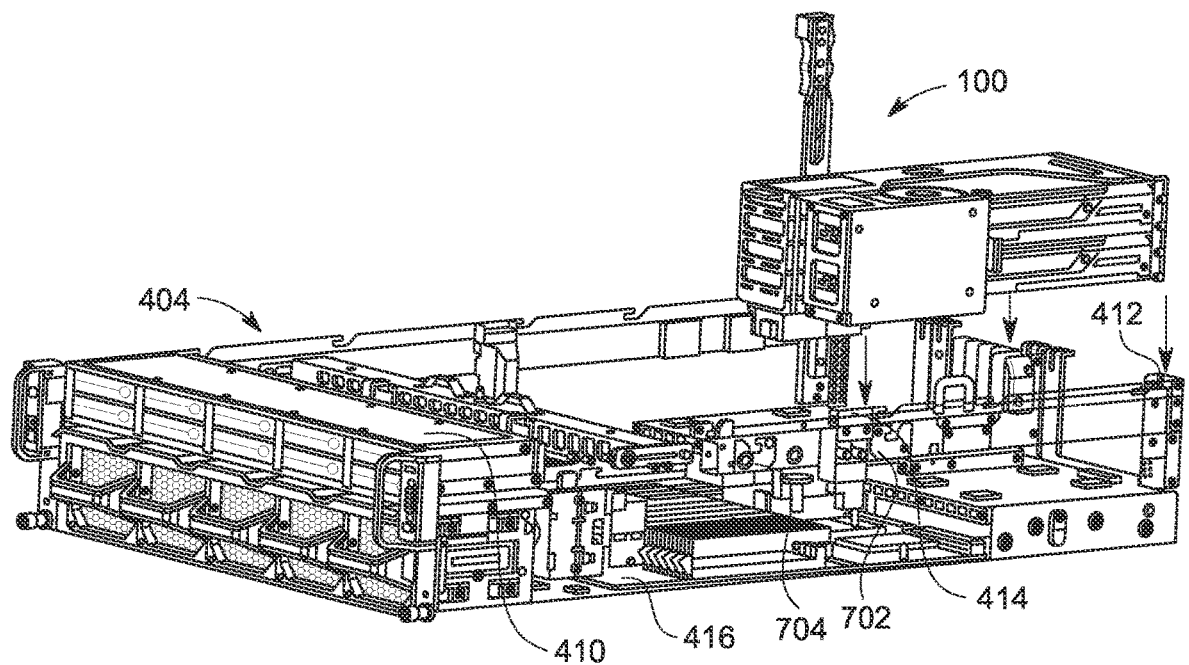
FIG. 4 is a front perspective view of a computing system and a riser cage, according to certain aspects of the present disclosure.
Figure 5:
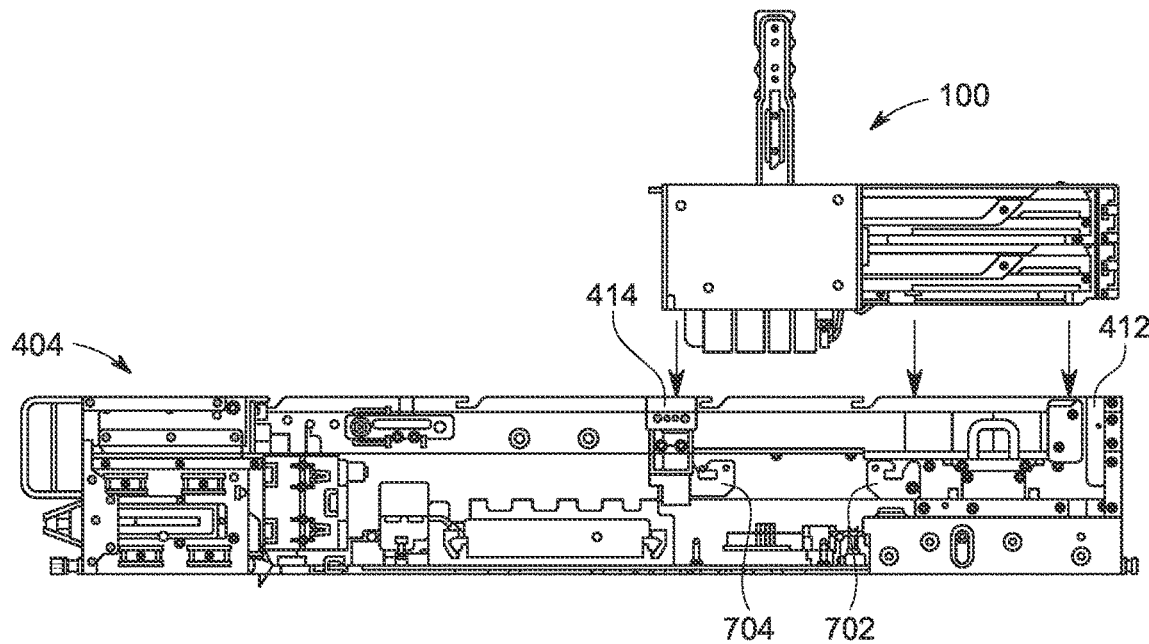
FIG. 5 is a side view of the computing system and the riser cage of FIG. 4, according to certain aspects of the present disclosure.

FIG. 4 is a front perspective view of a computing system 404 and the riser cage 100, according to certain aspects of the present disclosure. FIG. 5 is a side view of the computing system 404 and the riser cage 100, according to certain aspects of the present disclosure. Referring to both FIGS. 4 and 5, the riser cage 100 can be installed in the computing system 404. The computing system 404 includes a circuit board 416 and a chassis 410 for holding components of the computing system 404. The riser cage 100 can glide along sides 412, 414 of the chassis 410. Across from the sides 412 and 414, the chassis 410 also includes one or more locking hooks (e.g., a first locking hook 702 and a second locking hook 704) that can interface with the locking mechanism 103 (FIG. 1) of the riser cage 100.

Figure 6:
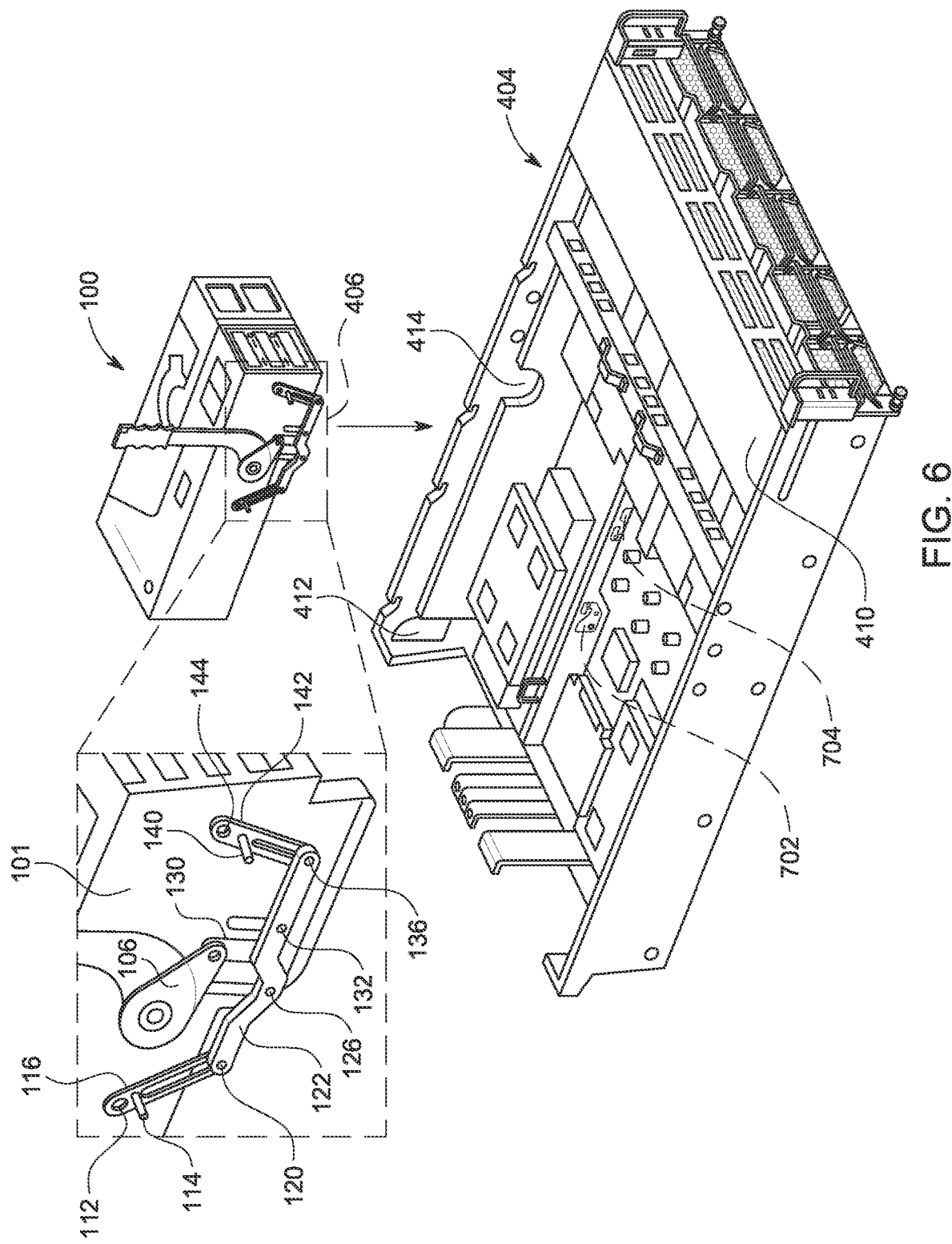
FIG. 6 is a top perspective view of the computing system and the riser cage of FIG. 4, according to certain aspects of the present disclosure.
Figure 7:
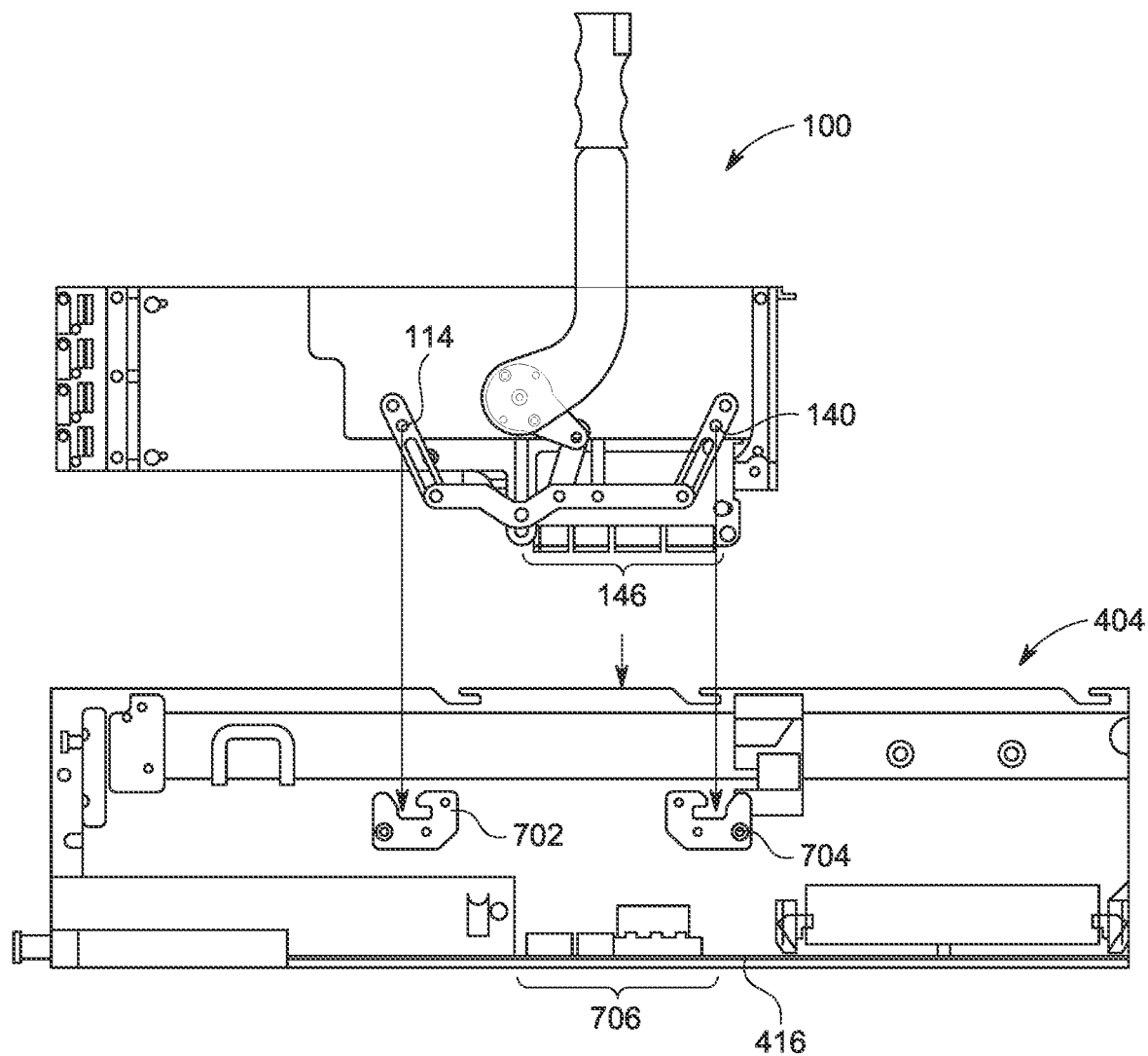
FIG. 7 is a side view of the computing system of FIG. 6, according to certain aspects of the present disclosure.

FIG. 6 is a top perspective view of the computing system 404 and the riser cage 100, according to certain aspects of the present disclosure. A side perspective view of the bar-linkage assembly 406 of the riser cage 100 is provided. The perspective view shows a three dimensional representation of the first locking protrusion 114 and the second locking protrusion 140. The first locking protrusion 114 and the second locking protrusion 140 are protrusions that facilitate securing the riser cage 100 to the chassis 404. FIG. 7 is a side view of the computing system 404 and the riser cage 100, according to certain aspects of the present disclosure. The first locking protrusion 114 can be received at the first locking hook 702, and the second locking protrusion 140 can be received at the second locking hook 704. When the riser cage 100 is properly installed in the computing system 404, the connector 146 will be properly mated to a connector 706 located on a circuit board 416 (e.g., a motherboard) in the computing system 404. The locking mechanism 103 (FIG. 1) should be in the unlocked position in order for the first locking protrusion 114 and the second locking protrusion 140 to be received at the first locking hook 702 and the second locking hook 704, respectively.

Figure 8:
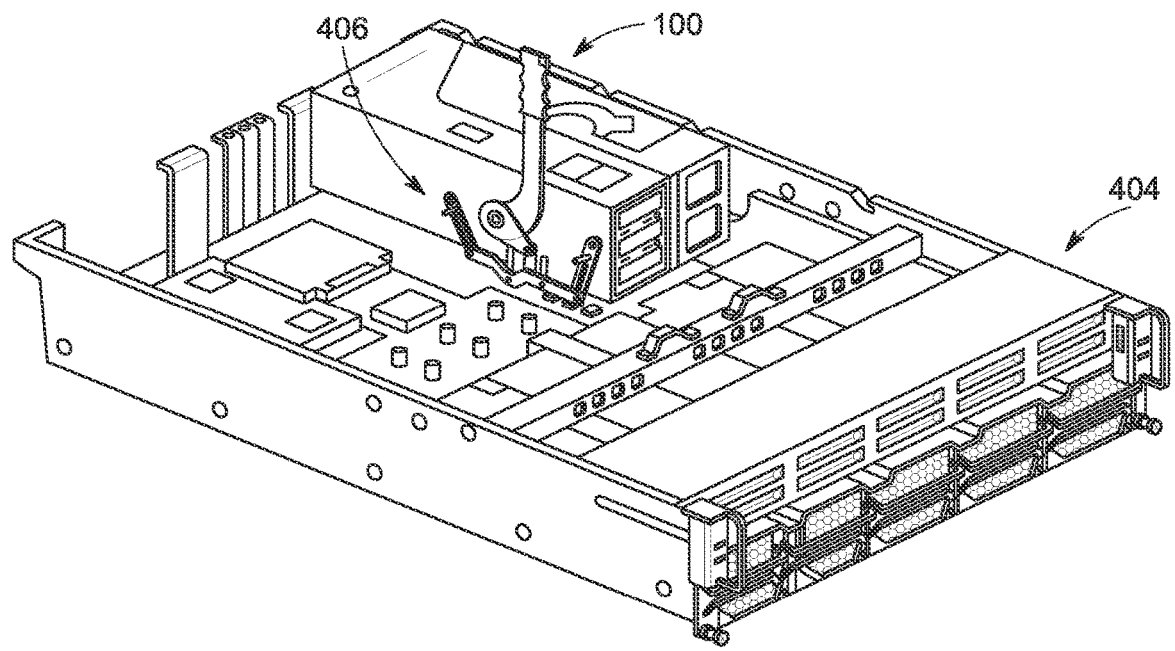
FIG. 8 is a top perspective view of the computing system of FIG. 4 with the riser cage positioned within the chassis of the computing system, according to certain aspects of the present disclosure.
Figure 9:
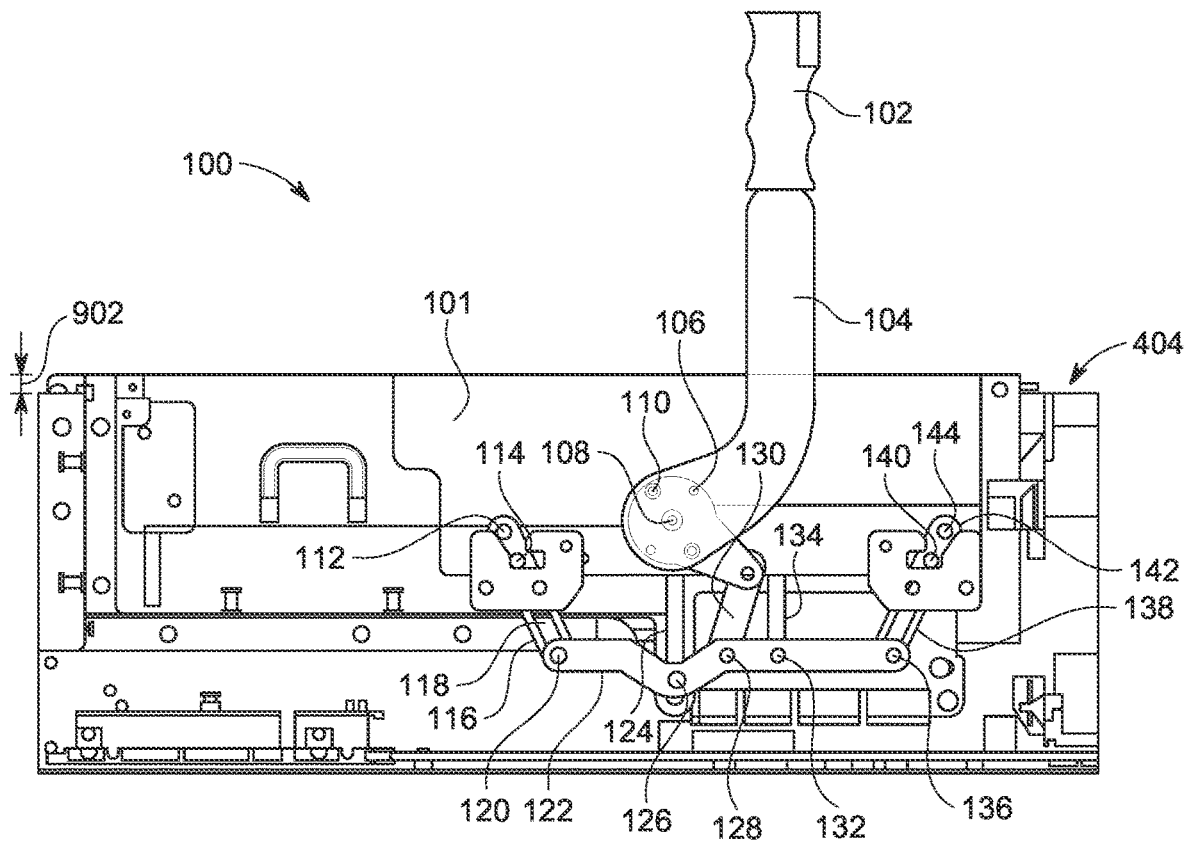
FIG. 9 is a side view of the computing system of FIG. 8, according to certain aspects of the present disclosure.

FIG. 8 is a top perspective view of the computing system 404 with the riser cage 100 positioned within the chassis 410 of the computing system 404, according to certain aspects of the present disclosure. To better see the status of the locking mechanism 103 (FIG. 1), the first and second locking hooks 702, 704 are not shown in FIG. 8. FIG. 9 is a side view of the computing system 404 with the positioned riser cage 100 of FIG. 8, according to certain aspects of the present disclosure. The side view of FIG. 9 shows how the riser cage 100 sits within the computing system 404 when the locking mechanism 103 (FIG. 1) is unlocked. The riser cage 100 extends a first height 902 above the computing system 404.

Figure 10:
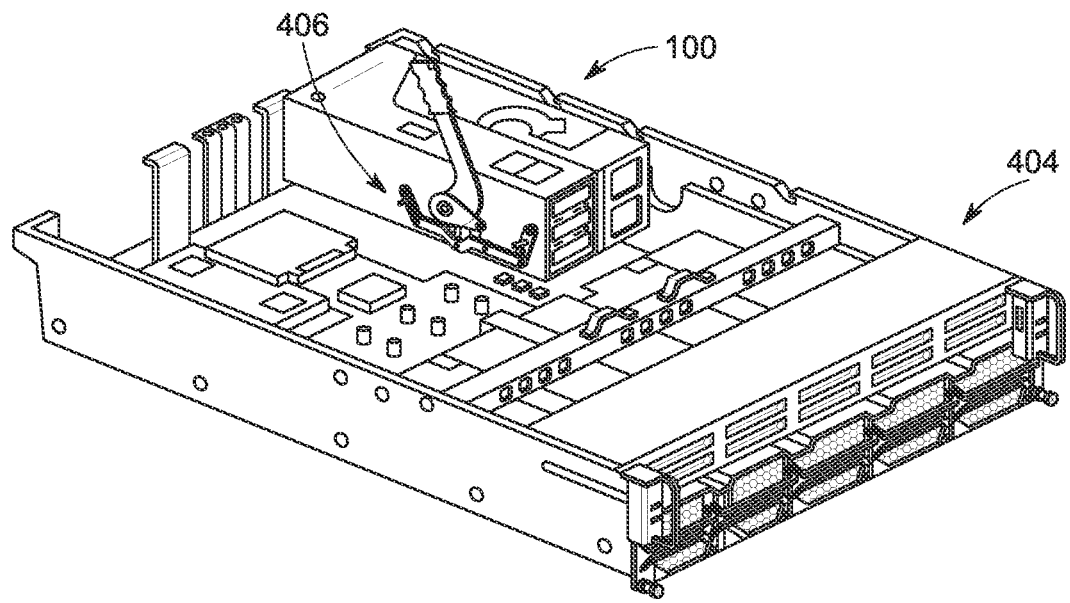
FIG. 10 is a top perspective view of the computing system of FIG. 4 with the locking mechanism of the riser cage in an intermediate position, according to certain aspects of the present disclosure.
Figure 11:
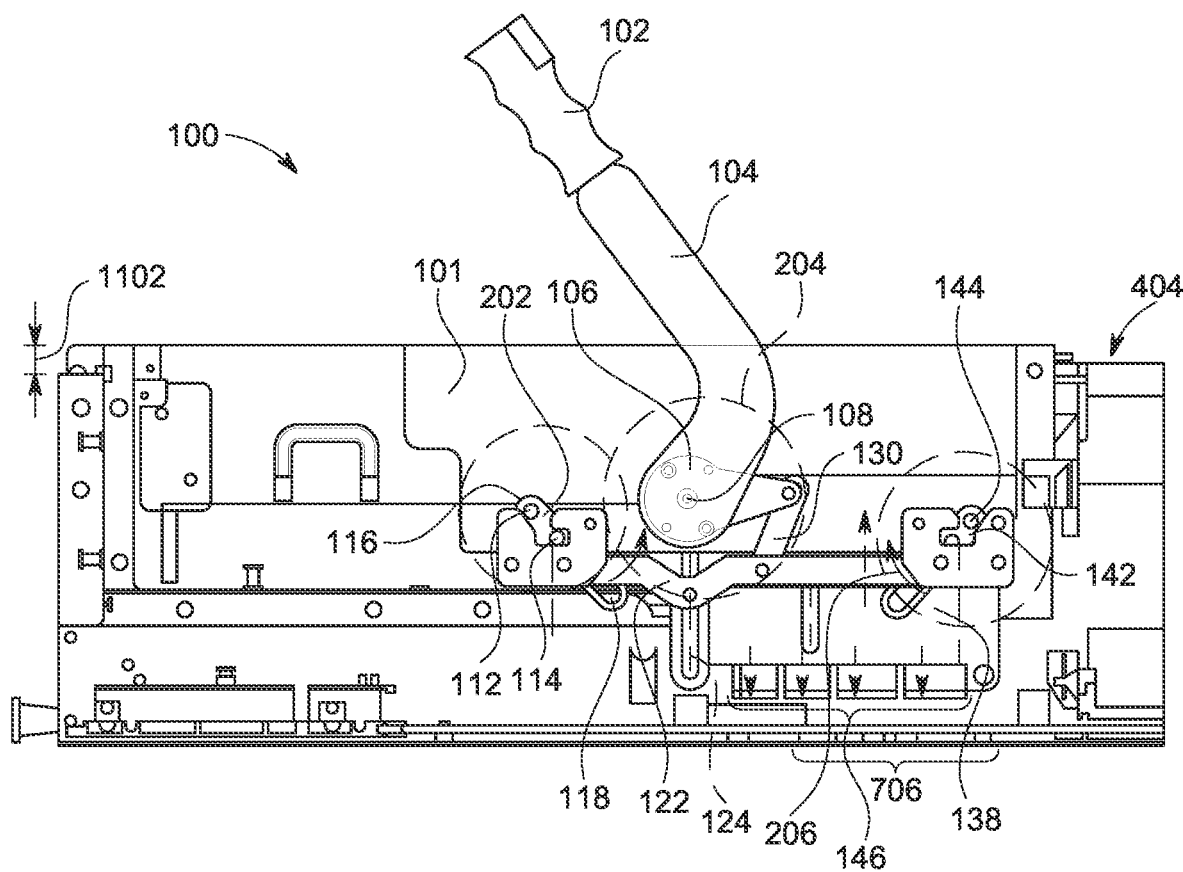
FIG. 11 is a side view of the computing system of FIG. 10, according to certain aspects of the present disclosure.

FIG. 10 is a top perspective view of the computing system 404 with the locking mechanism 103 of the riser cage 100 in an intermediate position, according to certain aspects of the present disclosure. FIG. 11 is a side view of the computing system 404 of FIG. 10, according to certain aspects of the present disclosure. When the handlebar 104 is rotated counterclockwise, the first bar 116 rotates counterclockwise, and the third bar 142 rotates clockwise, as discussed above in connection to FIG. 2. The counterclockwise motion of the first bar 116 and the clockwise motion of the third bar 142 pull the first locking protrusion 114 and the second locking protrusion 140 toward each other along the one or more locking hooks 702, 704. As the second locking protrusion 140 and the first locking protrusion 114 are pulled toward each other, the rotation of the first bar 116 and the third bar 142 pulls the riser cage 100 downward so that the connector 146 mates with the connector 706. FIG. 11 shows that the riser cage 100 extends a second height 1102 above the computing system 404. In some implementations, the second height 1102 is less than the first height 902.

Figure 12:
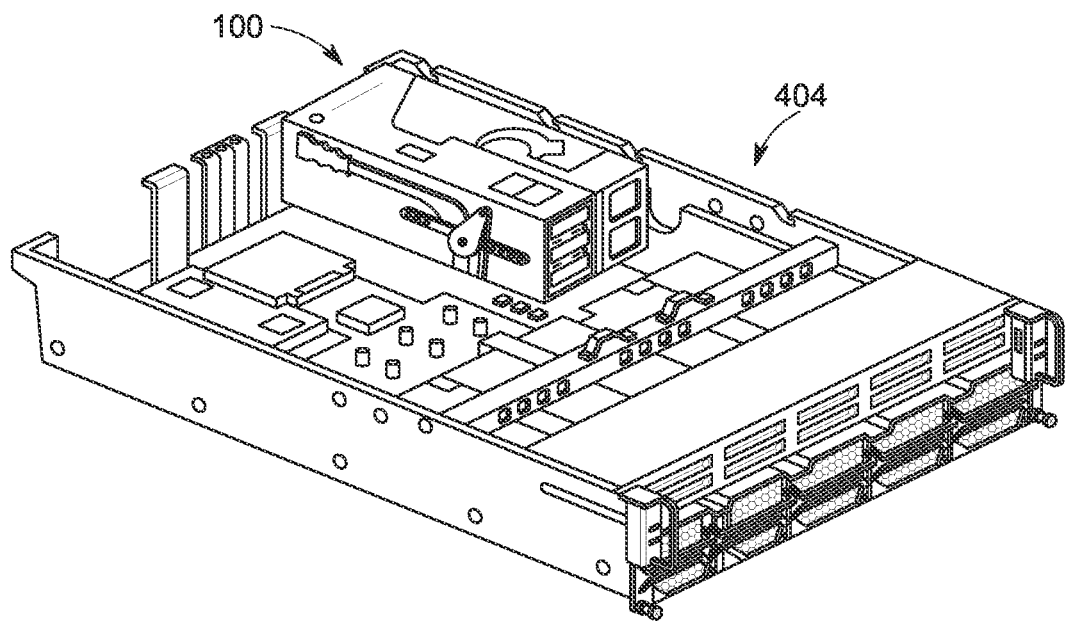
FIG. 12 is a top perspective view of the computing system of FIG. 4 with the locking mechanism of the riser cage in a locked position, according to certain aspects of the present disclosure.
Figure 13:
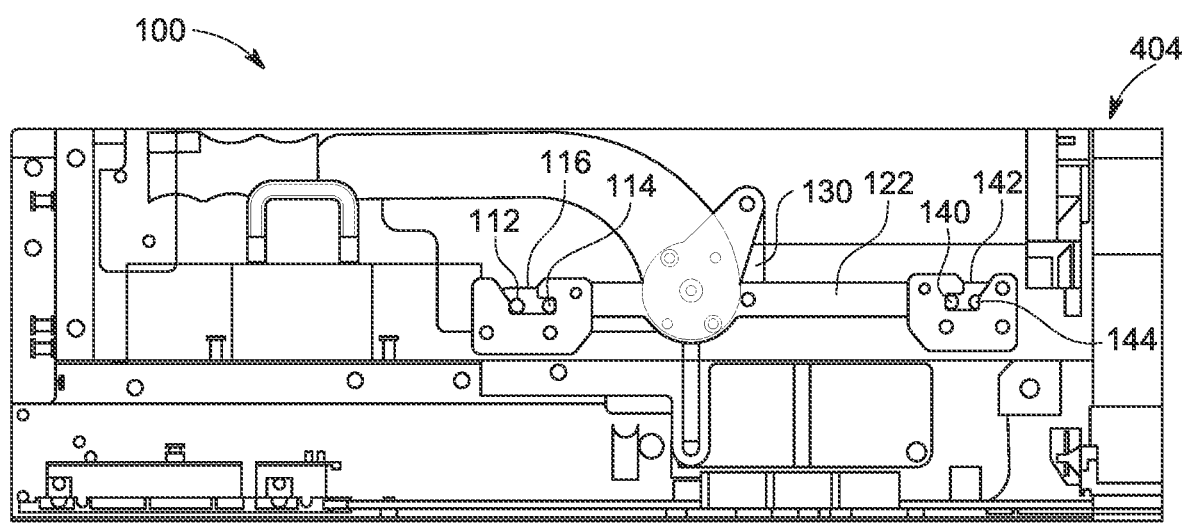
FIG. 13 is a side view of the computing system of FIG. 12, according to certain aspects of the present disclosure.

FIG. 12 is a top perspective view of the computing system 404 with the locking mechanism of the riser cage 100 in the locked position, according to certain aspects of the present disclosure. FIG. 13 is a side view of the computing system 404 of FIG. 12, according to certain aspects of the present disclosure. FIGS. 12 and 13 show the riser cage 100 in a position where the connector 146 and the connector 706 are completely mated. In comparing FIG. 11 to FIG. 13, the riser cage 100 is contained within the computing system 404 with no part of the riser cage 100 extending above the computing system 404. In some implementations, the riser cage 100 electronically connects to the computing system 404 using airmax connectors (i.e., the connector 146 and the connector 706 are airmax connectors that can mate with each other). The locking mechanism 103 allows a service technician to install the riser cage 100, overcoming forces (about 18 kilogram-force (kgf) generated by the mating of the airmax connectors. The locking mechanism 103 allows the service technician to disassemble and reassemble the riser cage 100 without much effort.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A computing system comprising:
a chassis including one or more locking hooks; and
a cage including a handlebar, a bar-linkage assembly, and a crank coupled to both the handlebar and the bar-linkage assembly such that rotating the handlebar from an unlocked position to a locked position lowers the cage relative to the chassis until the cage is locked in the one or more locking hooks of the chassis;
wherein the bar-linkage assembly includes a first bar, a second bar, a third bar, and a fourth bar, wherein the second bar is coupled to the first bar, the third bar, and the fourth bar, wherein the fourth bar is coupled the crank, wherein the first bar and the third bar engage with the one or more locking hooks of the chassis, and wherein the crank is configured to raise and lower the fourth bar relative to the chassis to control the engagement of the first bar and the third bar with the one or more locking hooks.

2. The computing system of claim 1, wherein the rotating the handlebar from the unlocked position to the locked position rotates the first bar in a same direction as the handlebar and rotates the third bar in an opposite direction than the first bar and the handlebar.

3. The computing system of claim 1, wherein rotating the handlebar from the unlocked position to the locked position increases (i) an angle between the second bar and the first bar and (ii) an angle between the second bar and the third bar.

4. The computing system of claim 1, wherein the first bar includes a first locking protrusion and the third bar includes a second locking protrusion, the first and second locking protrusions engaging the one or more locking hooks of the chassis to facilitate lowering the cage relative to the chassis.

5. The computing system of claim 4, wherein the locking protrusions engaging with the one or more locking hooks of the chassis causes the cage to lower relative to the chassis when the handlebar is rotated from the unlocked position to the locked position.

6. The computing system of claim 4, wherein the first locking protrusion and the second locking protrusion move toward each other when the handlebar is rotated from the unlocked position to the locked position.

7. The computing system of claim 1, wherein the chassis further includes one or more guides coupled to the second bar to prevent a rotation of the second bar, wherein rotating the handlebar from the unlocked position to the locked position causes the second bar to move along the one or more guides toward the crank.

8. The computing system of claim 1, wherein the first bar includes a first gliding section and the third bar includes a second gliding section so that rotating the handlebar from the unlocked position to the locked position causes the second bar to glide along the first gliding section and the second gliding section.

9. The computing system of claim 1, wherein at least a portion of the second bar has a curvature that matches a curvature of the crank.

10. The computing system of claim 1, wherein the crank has a teardrop shape and the crank is coupled to the bar-linkage assembly at the tip of the teardrop shape.

11. The computing system of claim 1, wherein the cage includes one or more electronic components with a first connector such that lowering the cage relative to the chassis mates the first connector with a second connector on a circuit board of the computing system.

12. A computing system comprising:
    a chassis including a locking hook; and
    a cage including
        a handlebar movable between an unlocked position and a locked position,
        a bar-linkage assembly having a plurality of interconnected bars, at least one bar of the plurality of interconnected bars having a locking protrusion, and
        a crank coupling the handlebar to the bar-linkage assembly, the crank rotating in response to movement of the handlebar, rotation of the crank causing engagement or disengagement between the locking protrusion and the locking hook, the locking protrusion being engaged to the locking hook in the unlocked position, the locking protrusion being disengaged from the locking hook in the locked position;
    wherein the plurality of interconnected bars includes a first bar, a second bar, a third bar, and a fourth bar, wherein the second bar is coupled to the first bar, the third bar, and the fourth bar, wherein the fourth bar is coupled the crank, wherein the locking protrusion is a plurality of locking protrusions located on the first bar and the third bar, and wherein the crank is configured to raise and lower the fourth bar to control the engagement of the locking protrusion with the locking hook.

13. The computing system of claim 12, wherein movement of the handlebar from the unlocked position to the locked position involves rotating the handlebar, the movement of the handlebar causing the first bar to rotate in a same direction as the handlebar, and causing the third bar to rotate in an opposite direction than the first bar and the handlebar.

14. The computing system of claim 12, wherein movement of the handlebar from the unlocked position to the locked position increases (i) an angle between the second bar and the first bar and (ii) an angle between the second bar and the third bar.

15. The computing system of claim 12, wherein at least a portion of the second bar has a curvature that matches a curvature of the crank.

16. The computing system of claim 12, wherein the plurality of locking protrusions engaging with the chassis causes the cage to lower relative to the chassis of the computing system when the handlebar moves from the unlocked position to the locked position.

17. The computing system of claim 12, wherein the plurality of locking protrusions moves toward each other when the handlebar moves from the unlocked position to the locked position.

18. The computing system of claim 12, wherein the first bar and the third bar are coupled to the second bar at opposite ends of the second bar.

19. The computing system of claim 1, wherein when the handlebar is in the locked position, the first bar and the third bar are in-line with each other, and when the handlebar is in the unlocked position, the first bar and the third bar are at an angle.

20. The computing system of claim 12, wherein when the handlebar is in the locked position, the first bar and the third bar are in-line with each other, and when the handlebar is in the unlocked position, the first bar and the third bar are at an angle.

\* \* \* \* \*